US012599017B2

(12) United States Patent
Kim et al.

(10) Patent No.: US 12,599,017 B2
(45) Date of Patent: Apr. 7, 2026

(54) PACKAGE SUBSTRATE

(71) Applicant: LG INNOTEK CO., LTD., Seoul (KR)

(72) Inventors: Nam Heon Kim, Seoul (KR); Chang Je Kim, Seoul (KR); Seong Hwan Im, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 669 days.

(21) Appl. No.: 17/927,820

(22) PCT Filed: May 26, 2021

(86) PCT No.: PCT/KR2021/006563
§ 371 (c)(1),
(2) Date: Nov. 25, 2022

(87) PCT Pub. No.: WO2021/242013
PCT Pub. Date: Dec. 2, 2021

(65) Prior Publication Data
US 2023/0223308 A1      Jul. 13, 2023

(30) Foreign Application Priority Data

May 26, 2020      (KR) ......................... 10-2020-0063020

(51) Int. Cl.
*H01L 23/13*      (2006.01)
*H01L 23/485*      (2006.01)
*H01L 23/498*      (2006.01)
(52) U.S. Cl.
CPC ............ *H01L 23/13* (2013.01); *H01L 23/485* (2013.01); *H01L 23/49838* (2013.01); *H01L 23/49894* (2013.01)
(58) Field of Classification Search
None
See application file for complete search history.

(56) References Cited

U.S. PATENT DOCUMENTS

| | | | |
|---|---|---|---|
| 7,563,650 B2 | 7/2009 | Nishikawa | |
| 8,035,202 B2 | 10/2011 | Watanabe et al. | |

(Continued)

FOREIGN PATENT DOCUMENTS

| | | |
|---|---|---|
| JP | 2004-253667 | 9/2004 |
| JP | 2004-311497 | 11/2004 |

(Continued)

OTHER PUBLICATIONS

Extended European Search Report dated Jul. 9, 2024 issued in Application No. 21811834.7.

(Continued)

*Primary Examiner* — Long Pham
(74) *Attorney, Agent, or Firm* — KED & ASSOCIATES, LLP

(57) ABSTRACT

A package substrate according to an embodiment includes a first substrate; and a first chip mounted on the first substrate; wherein the first substrate includes: a first insulating layer including a first region overlapping the first chip in a vertical direction and a second region other than the first region; and a circuit pattern disposed on the first region and the second region of the first insulating layer; wherein the circuit pattern includes: a pad portion including a first portion disposed on an upper surface of the second region of the first insulating layer, a second portion buried in the first region of the first insulating layer, and a third portion including at least a part buried in the first region of the first insulating layer and connecting between the first portion and the second portion; wherein at least a part of the first chip is disposed in the first region of the first insulating layer; wherein the first region of the first insulating layer surrounds a lower surface and a side surface of the first chip, and wherein the first region and the second region of the first insulating layer are a single insulating layer.

15 Claims, 9 Drawing Sheets

100

(56)                References Cited

U.S. PATENT DOCUMENTS

| | | | |
|---|---|---|---|
| 10,937,771 B2* | 3/2021 | Kim | H01L 25/105 |
| 2004/0082107 A1 | 4/2004 | Shi et al. | |
| 2007/0075436 A1* | 4/2007 | Watanabe | H01L 24/83 |
| | | | 257/E21.511 |
| 2009/0020870 A1 | 1/2009 | Watanabe et al. | |
| 2009/0267214 A1 | 10/2009 | Kumazawa et al. | |
| 2009/0321965 A1 | 12/2009 | Watanabe et al. | |
| 2011/0317388 A1 | 12/2011 | Watanabe et al. | |
| 2016/0300812 A1* | 10/2016 | Chen | H01L 23/3128 |
| 2018/0138137 A1 | 5/2018 | Jin et al. | |
| 2021/0242118 A1* | 8/2021 | Song | H01L 23/49838 |

FOREIGN PATENT DOCUMENTS

| | | |
|---|---|---|
| JP | WO2006-109383 | 10/2006 |
| JP | 2006-324602 | 11/2006 |
| JP | 2009-218613 | 9/2009 |
| JP | 2011-249419 | 12/2011 |
| KR | 10-877443 | 1/2009 |
| KR | 10-2013-0040639 | 4/2013 |
| KR | 10-1936213 | 1/2019 |

OTHER PUBLICATIONS

Korean Office Action dated Sep. 20, 2024 issued in Application No. 10-2020-0063020.

Japanese Office Action dated Apr. 8, 2025 issued in Application No. 2022-573340.

International Search Report dated Sep. 28, 2021 issued in Application No. PCT/KR2021/006563.

Japanese Office Action dated Dec. 24, 2024.

* cited by examiner

【FIG. 1】
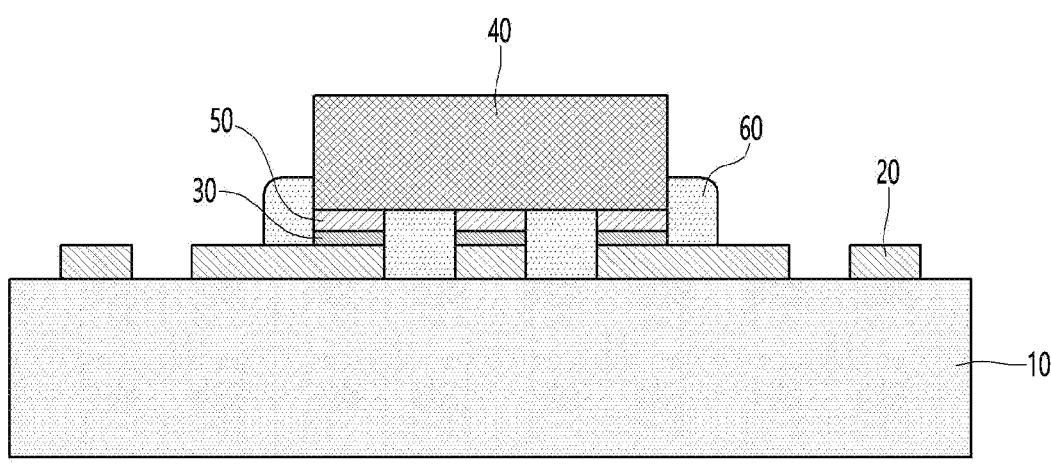
【FIG. 2】
100
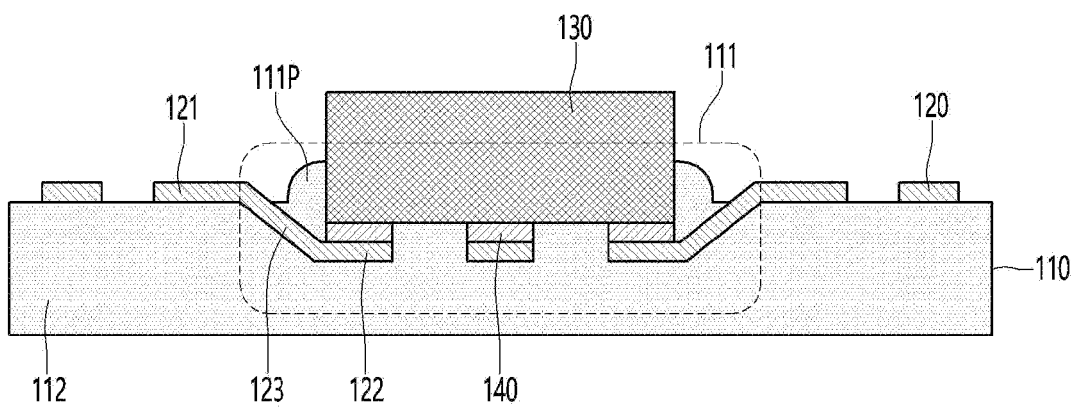

【FIG. 3】
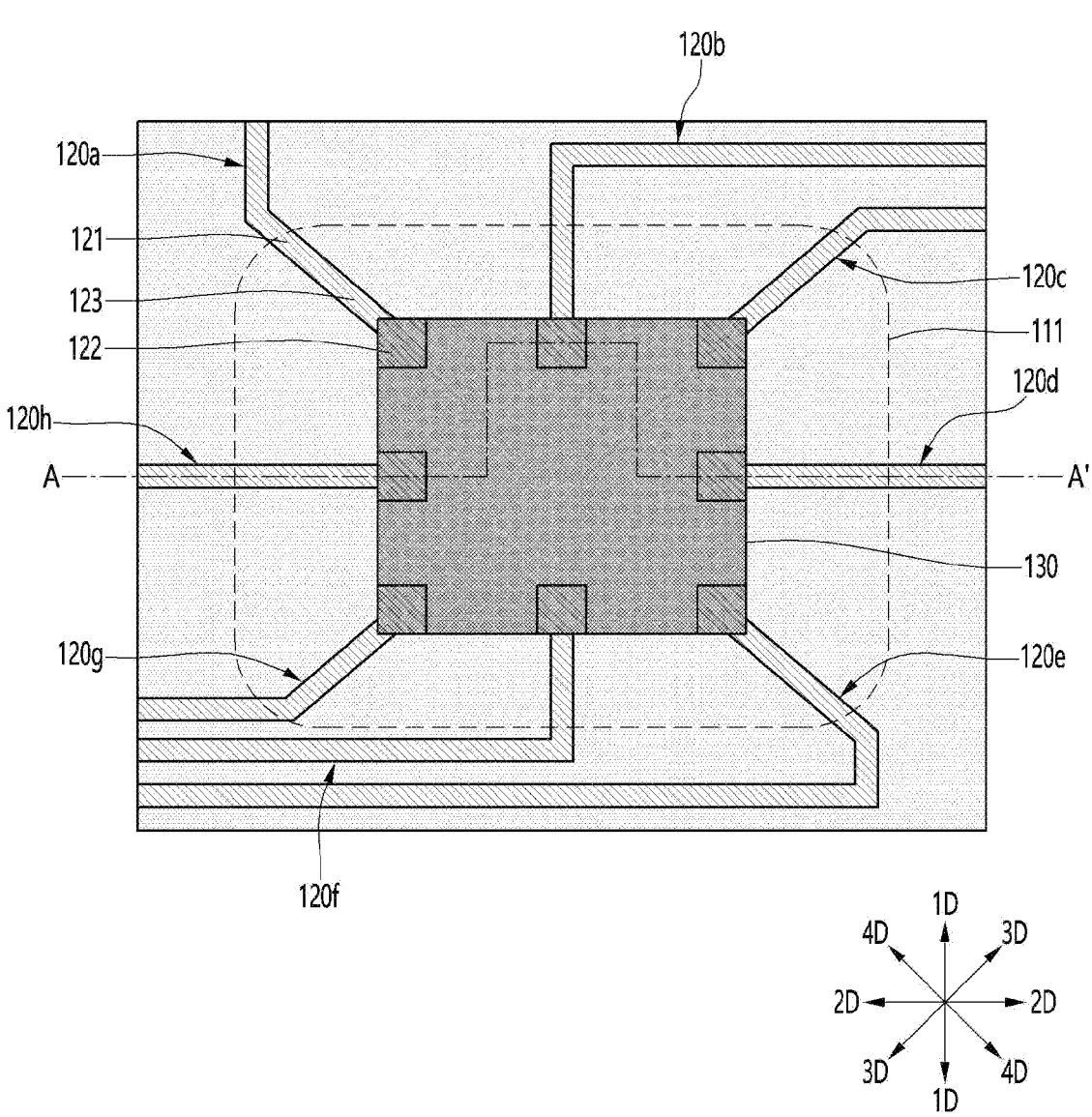

【FIG. 4】
100A
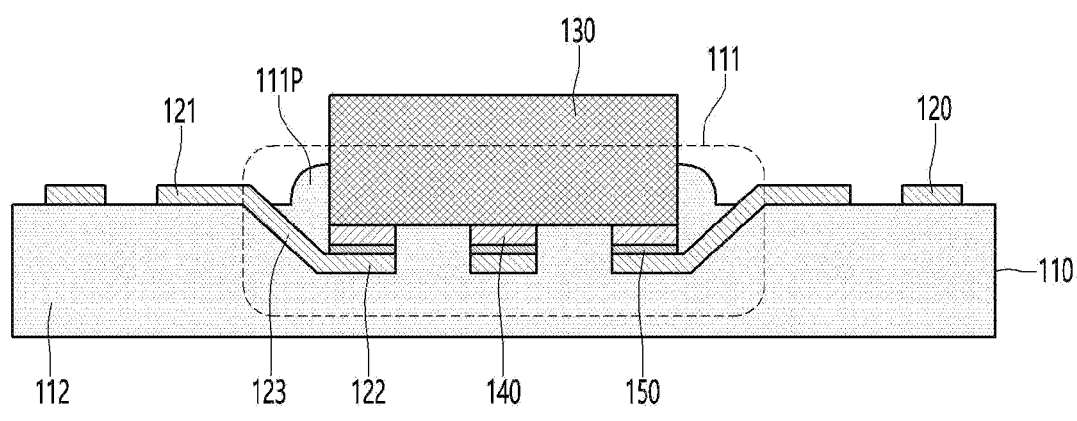
【FIG. 5】
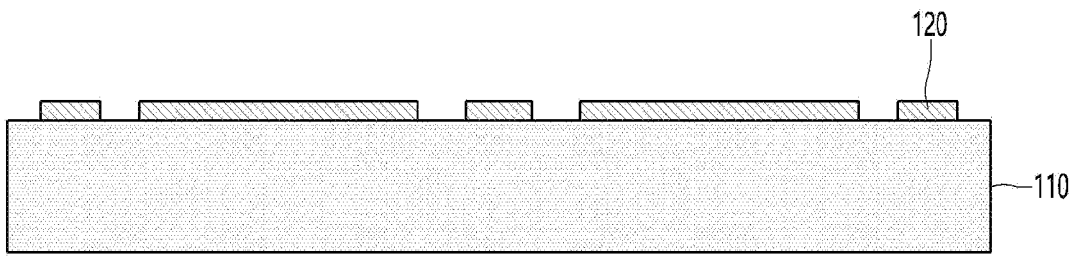

【FIG. 6】
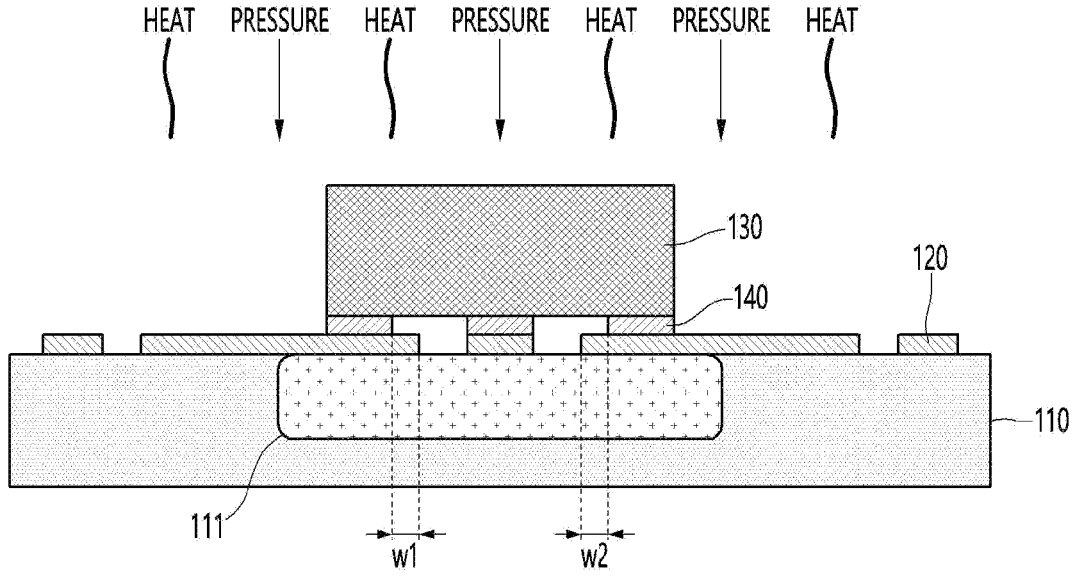
【FIG. 7】
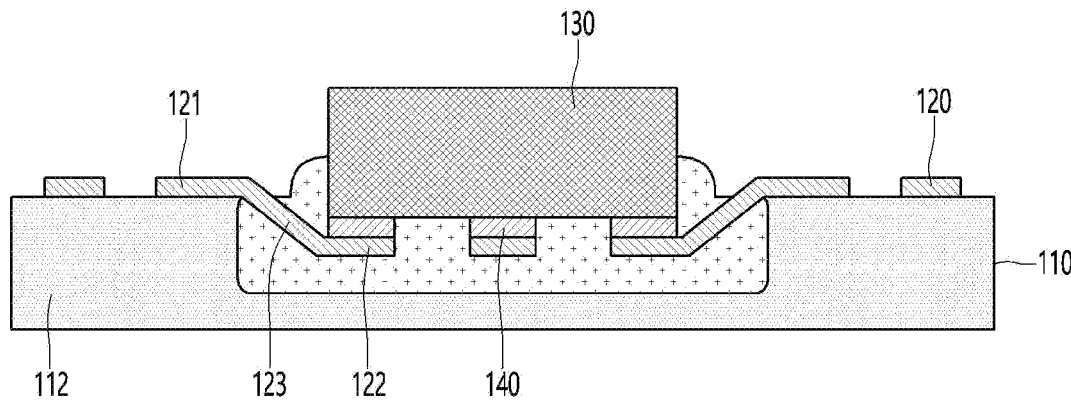

【FIG. 8】
100
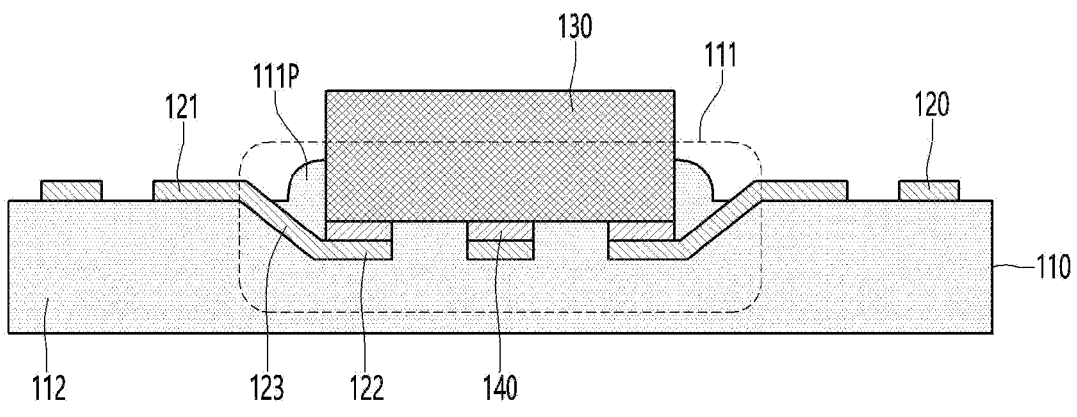
【FIG. 9】
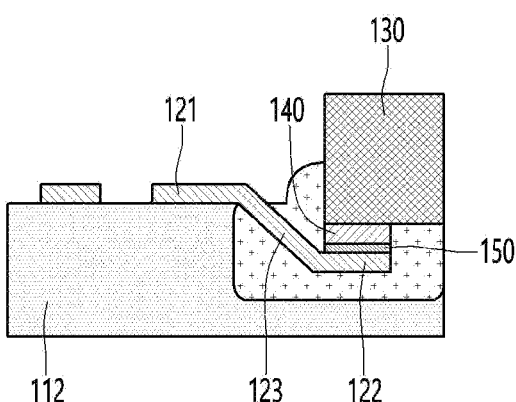

【FIG. 10】
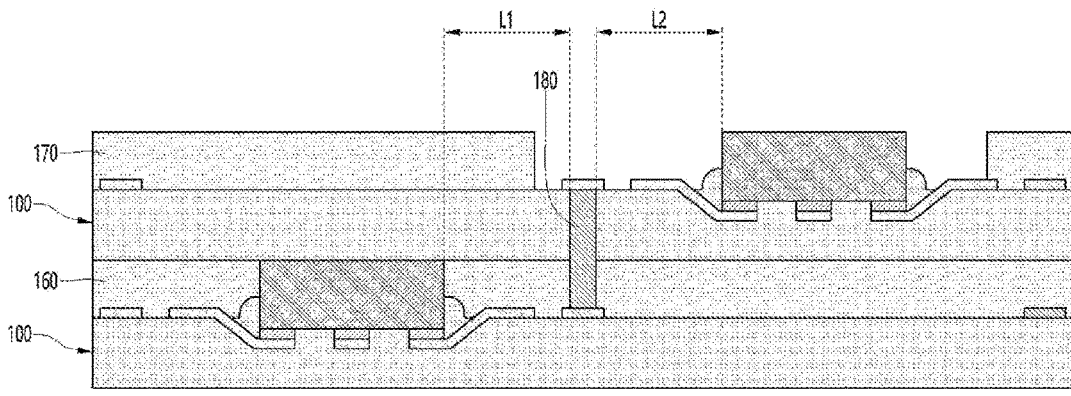
【FIG. 11】
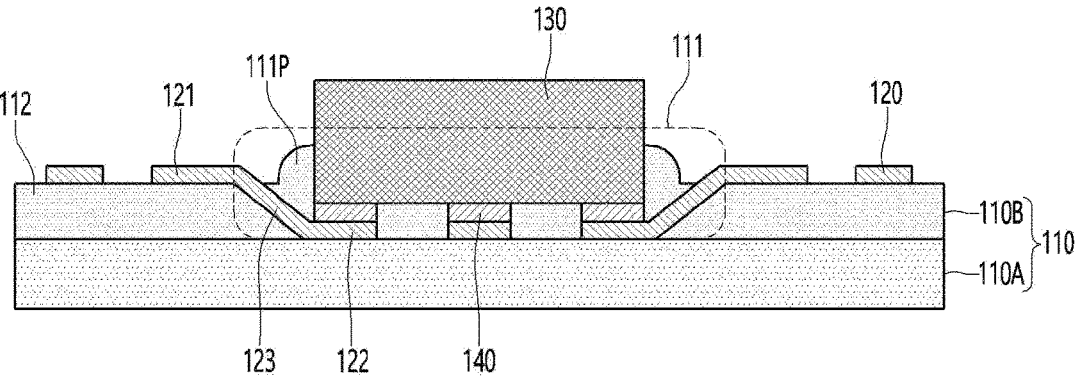

【FIG. 12A】
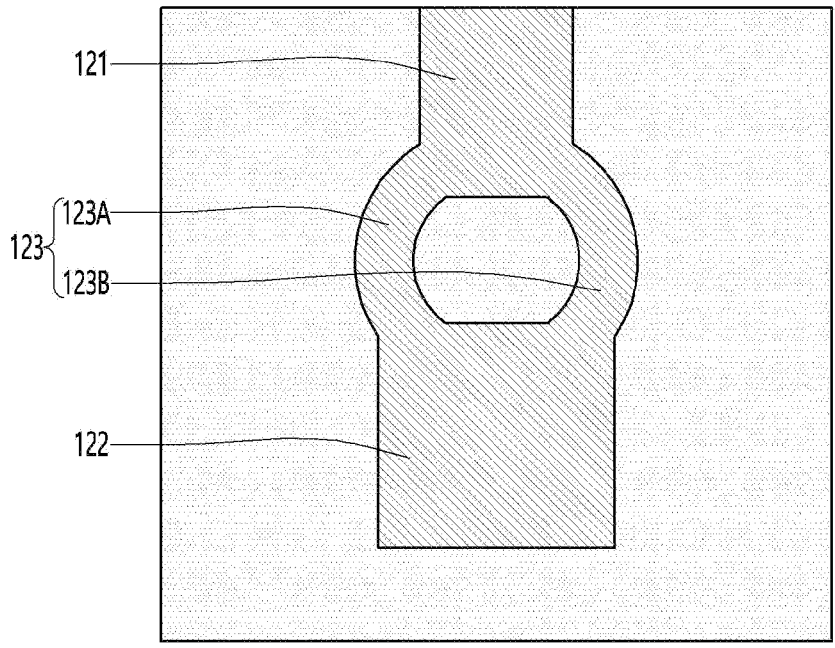
【FIG. 12B】
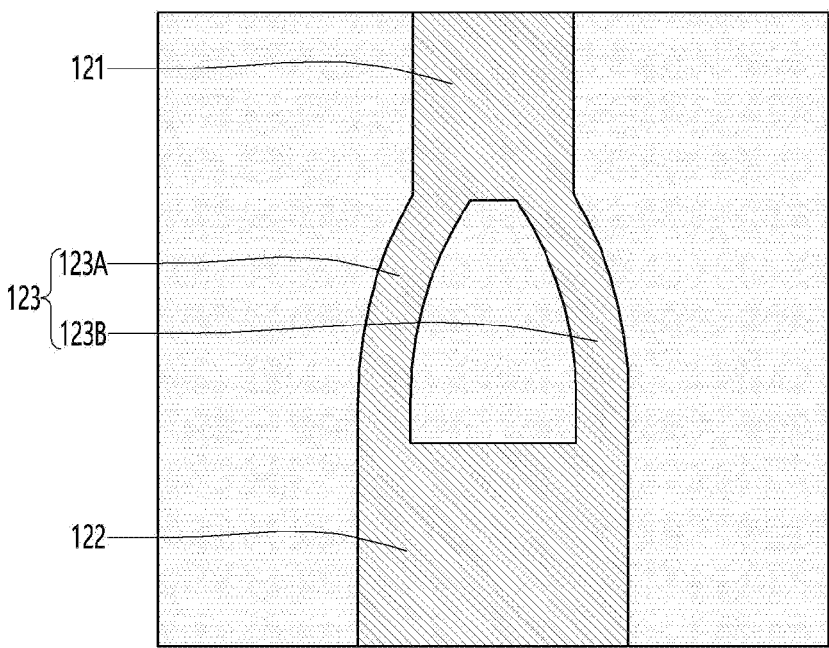

【FIG. 13】
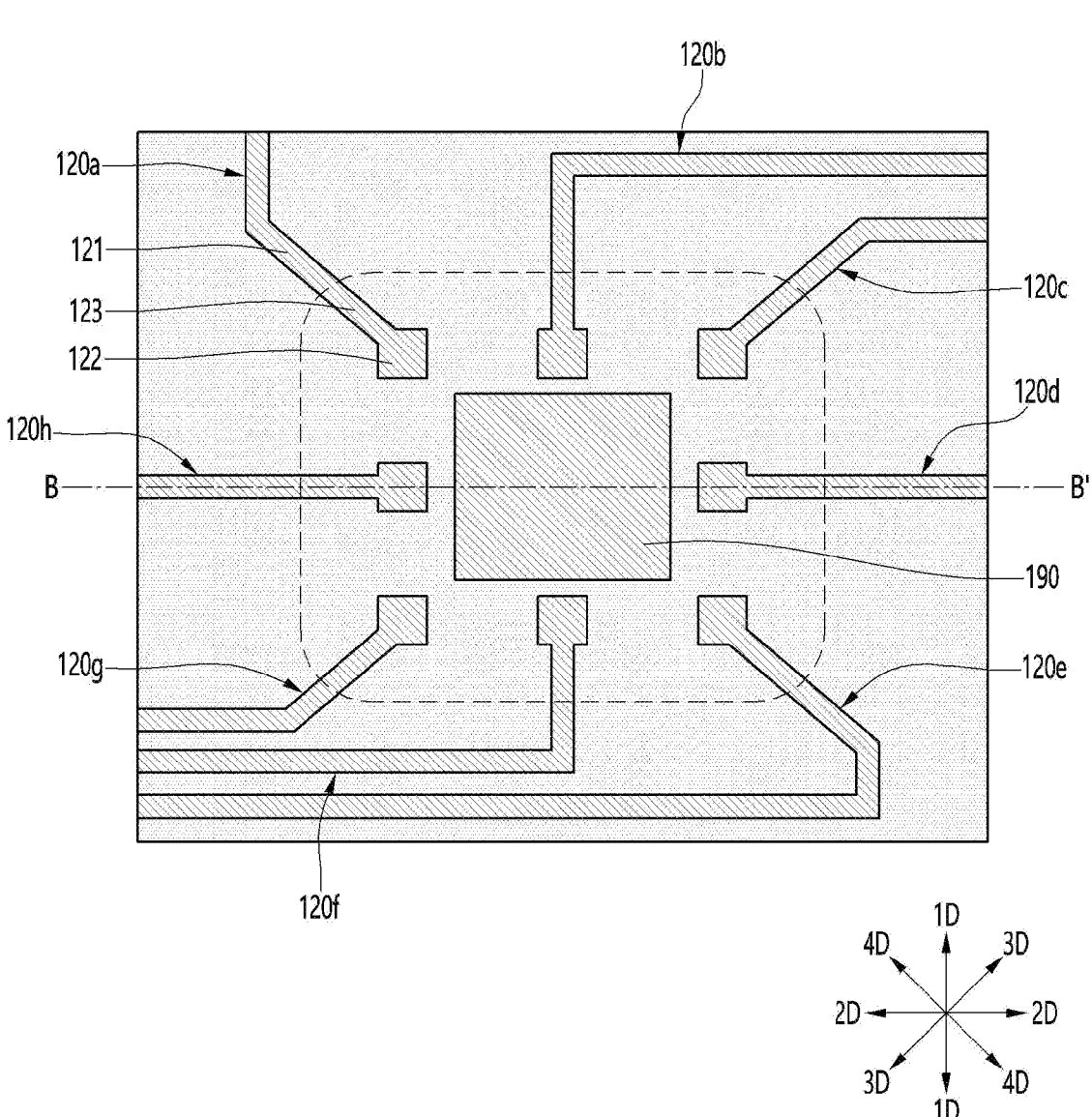

【FIG. 14A】
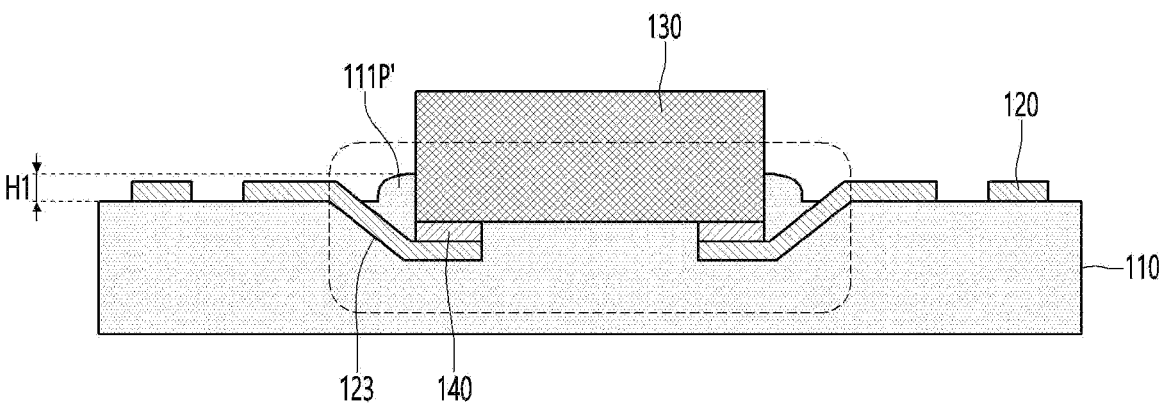
【FIG. 14B】
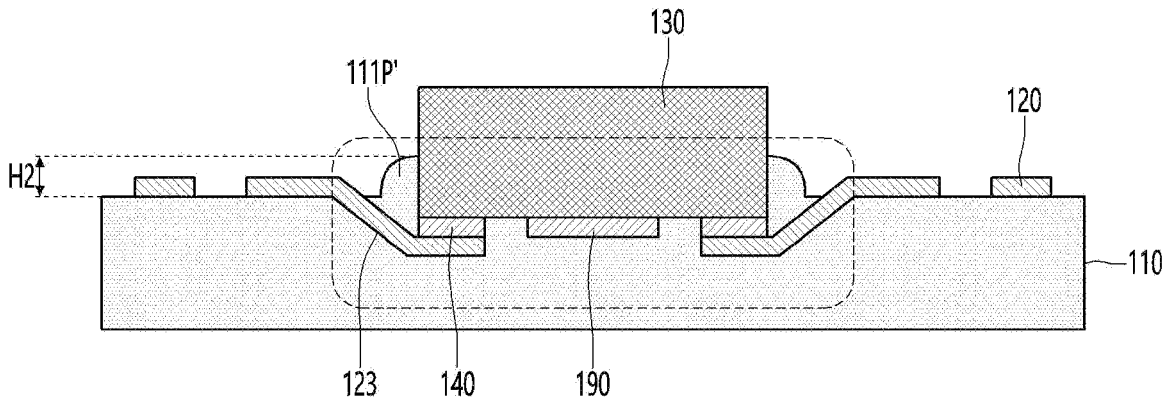

PACKAGE SUBSTRATE

CROSS-REFERENCE TO RELATED PATENT APPLICATIONS

This application is a U.S. National Stage Application under 35 U.S.C. § 371 of PCT Application No. PCT/KR2021/006563, filed May 26, 2021, which claims priority to Korean Patent Application No. 10-2020-0063020, filed May 26, 2020, whose entire disclosures are hereby incorporated by reference.

TECHNICAL FIELD

An embodiment relates to a package substrate.

BACKGROUND ART

A demand for the integration of a semiconductor device and miniaturization and weight reduction of the integrated device is gradually increasing in the dimension of effective overcoming of the development of information and communication and the complexity of equipment, and accordingly, a plurality of chips are mounted in a single space, that is, packaged semiconductors are generally used.

Packaging is completed by mounting a chip on a substrate on which an external terminal is formed and additionally molding.

Here, the external terminal refers to a terminal formed on a substrate that electrically connects the substrate and the chip, and the packaging may be classified into wire bonding, flip chip bonding, and the like, depending on the connection type between the external terminal and the chip.

To elaborate on the general description, the wire bonding method is a method of placing a chip on a substrate on which leads are formed and connecting an external terminal and an electrode pattern of a semiconductor chip using fine wires. The flip-chip bonding method refers to a method in which a protrusion called a solder ball made of a material such as Sn/Pb is formed on an electrode pattern and electrically connected when the chip is mounted on a substrate through this.

Here, the flip-chip type packaging method is a method of mounting a chip with solder balls or bumps formed thereon so that the flip surface faces the substrate direction, unlike the wire bonding method, and it is a technology that can realize the smallest form among semiconductor packaging.

That is, the flip-chip bonding method refers to a method of forming a conductive bump on an input/output terminal electrode of a semiconductor device and forming an electrical connection between the bump and a pad that is an electrode terminal included in a substrate.

However, the flip-chip bonding method as described above has a problem in that the adhesion reliability between the pads of the bumps is weakened in a process of connecting the pad and the bump as described above.

In order to improve this problem and reinforce the adhesive force between the bump and the pad, an epoxy resin or the like is applied to the space between the pads of the bumps, which is called underfill.

That is, a process for forming the underfill is essentially included in the package substrate to which a conventional flip-chip bonding method is applied as described above, and there is a problem that a separate time is required for the shape of the underfill.

In addition, a separate space for forming the underfill is required in the package substrate of the flip-chip bonding method as described above, and there is a problem in that the size of the substrate for securing the space is increased.

Accordingly, there is a demand for a package substrate to which an underfill of a new structure is applied.

DISCLOSURE

Technical Problem

An embodiment provides a package substrate having a new structure and a method of manufacturing the same.

In addition, the embodiment provides a package substrate capable of omitting a process of forming an underfill or a process of curing the underfill, and a method of manufacturing the same.

In addition, the embodiment provides a package substrate capable of forming an underfill surrounding a chip by using an insulating layer constituting the substrate, and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A package substrate according to an embodiment includes a first substrate; and a first chip mounted on the first substrate; wherein the first substrate includes: a first insulating layer including a first region overlapping the first chip in a vertical direction and a second region other than the first region; and a circuit pattern disposed on the first region and the second region of the first insulating layer; wherein the circuit pattern includes: a pad portion including a first portion disposed on an upper surface of the second region of the first insulating layer, a second portion buried in the first region of the first insulating layer, and a third portion including at least a part buried in the first region of the first insulating layer and connecting between the first portion and the second portion; wherein at least a part of the first chip is disposed in the first region of the first insulating layer; wherein the first region of the first insulating layer surrounds a lower surface and a side surface of the first chip, and wherein the first region and the second region of the first insulating layer are a single insulating layer.

In addition, the third portion of the pad portion is disposed at a predetermined inclination angle with respect to a lower surface of the first insulating layer in the first region of the first insulating layer.

In addition, the third portion of the pad portion includes a plurality of branch lines connecting between the first portion and the third portion of the pad portion and spaced apart from each other.

In addition, the third portion of the pad portion is disposed with a directionality corresponding to a position at which the second portion of the pad portion is disposed based on a central region of the first region of the first insulating layer.

In addition, the first substrate includes a second insulating layer disposed under a lower surface of the first insulating layer; and wherein the second insulating layer includes a cured epoxy or a thermoplastic resin having a glass transition temperature higher than a glass transition temperature of the first insulating layer.

In addition, the second portion of the pad portion is disposed on an upper surface of the second insulating layer.

In addition, the pad portion includes a plurality of pad portions, and wherein the circuit pattern includes a dummy pad positioned between third portions of the plurality of pad portions and electrically insulated from the first chip.

In addition, the package substrate further includes a bump disposed under a lower surface of the first chip; and wherein the bump is buried in the first region of the first insulating layer and is in direct contact with an upper surface of the third portion of the pad portion.

In addition, the package substrate further includes a second substrate disposed on the first substrate and on which a second chip is mounted; and wherein an insulating layer of the second substrate is lower than a glass transition temperature of the first insulating layer of the first substrate.

In addition, the first insulating layer includes at least one thermoplastic resin of Polyethylene terephthalate (PET), Liquid Crystal Polymer (LCP), Polyether ether ketone (PEEK), Polytetrafluoroethylene (PTFE), Poly Phenylene Sulfide (PPS), Photo-isotropic polymethyl methacrylate (PMMA) or a liquid crystal polymer (LCP) having a grain direction in the first region different from a grain direction in the second region.

In addition, the first insulating layer includes a liquid crystal polymer (LCP) having a grain in a specific direction, wherein a grain direction in the first region of the first insulating layer is different from a grain direction in the second region of the first insulating layer.

In addition, a hardness of the first region of the first insulating layer is different from a hardness of the second region of the first insulating layer.

In addition, an upper surface of the first region of the first insulating layer is higher than an upper surface of the second region of the first insulating layer.

On the other hand, a manufacturing method of the package substrate according to the embodiment includes preparing a first insulating layer; forming a circuit pattern on the first insulating layer; and applying heat and pressure while aligning a chip on the circuit pattern so that at least a part of the chip is buried in the first insulating layer, wherein the first insulating layer includes a first region overlapping the aligned chip in a vertical direction and a second region other than the first region, wherein the forming of the circuit pattern includes forming a pad portion including a first portion disposed on an upper surface of the second region of the first insulating layer, a second portion disposed on an upper surface of the second region of the first insulating layer, and a third portion disposed on an upper surface of the second region of the first insulating layer and connecting the first portion and the second portion, wherein the burying of the chip includes softening the first region of the first insulating layer by the heat; burying a lower region of the chip, the second portion and the third portion of the pad portion in a first region of the softened first insulating layer; and curing the first region of the first insulating layer; wherein the first region of the first insulating layer after the curing forms an underfill surrounding a lower surface and a side surfaces of the chip, and wherein the first region and the second region of the first insulating layer are a single insulating layer including the same insulating material.

In addition, the third portion of the pad portion after the curing is disposed to have a predetermined inclination angle with respect to a lower surface of the first insulating layer in the first region of the first insulating layer.

In addition, the third portion of the pad portion includes a plurality of branch lines connecting between the first portion and the third portion of the pad portion and spaced apart from each other.

In addition, the third portion of the pad portion is disposed with a directionality corresponding to a position at which the second portion of the pad portion is disposed based on a central region of the first region of the first insulating layer.

In addition, the manufacturing method further includes forming a second insulating layer under a lower surface of the first insulating layer before burying the chip, wherein the second insulating layer is a cured epoxy or a thermoplastic resin having a glass transition temperature higher than a glass transition temperature of the first insulating layer.

In addition, the pad portion includes a plurality of pad portions, and wherein the forming the circuit pattern includes forming a dummy pad positioned between third portions of the plurality of pad portions and electrically insulated from the first chip.

In addition, the first insulating layer includes a liquid crystal polymer (LCP) having a grain in a specific direction, and wherein a grain direction in the first region of the first insulating layer after the curing is different from a grain direction in the second region of the first insulating layer after the curing.

Advantageous Effects

According to the present embodiment, an insulating layer of the package substrate includes a first region in which the chip is buried and a second region other than the first region. In addition, the first region may include a first portion surrounding a lower surface of the chip. The first portion may be in contact with a lower surface of the chip. The first portion may be in contact with a side surface of the bump of the chip. The first portion may be in contact with a side surface of a circuit pattern connected to the bump. That is, the first portion may be formed to surround the lower surface of the chip, the side surface of the bump, and the side surface of the circuit pattern. In addition, the first region of the insulating layer may include a second portion extending from the first portion. The second portion may form a fillet or an underfill surrounding a side surface of the chip. That is, the second portion of the first region may maintain a flat surface, and may have a convex shape protruding upward when the chip is buried in the first region. Accordingly, the embodiment may form an underfill surrounding the chip by using the insulating layer on which the chip is mounted in a bonding process of the chip. Accordingly, the embodiment may omit the process of forming a separate underfill, thereby simplifying a manufacturing process and shortening a manufacturing time.

In addition, the embodiment allows the lower region of the chip to be buried in the first region of the insulating layer. Accordingly, the embodiment may reduce the overall thickness of the package substrate to correspond to the degree of burying of the chip.

In addition, the circuit pattern according to the embodiment includes a plurality of pad portions including first to third portions. In this case, each of the second portions of the plurality of pad portions may have a radial shape within the first region of the insulating layer and may be disposed to be spaced apart from each other by a predetermined distance. Accordingly, the embodiment can solve a reliability problem that may occur when the second portion of the pad portion is moved.

That is, the second portion of each of the pad portions may move (eg, elastically extend) in a specific direction during the bonding process of the chip. In this case, when an arrangement direction of the second portion of each of the pad portions is different from the moving direction, reliability problems such as breakage of the second portion during the moving process may occur. Accordingly, the reliability of the second portion can be improved even after the chip 130 is bonded by making the second portion of each of the pad portions of the embodiment to be arranged in a direction corresponding to the moving direction in the bonding process of the chip.

In addition, the embodiment may include a dummy pad disposed in the first region of the insulating layer. The dummy pad is a dummy pattern that is not electrically connected to the pad portion and the chip. And, the bonding of the chip of the embodiment is performed in a state in which the dummy pad is disposed. Accordingly, the embodiment may increase the degree of protrusion of the first region of the insulating layer, that is, the height of the underfill, by the dummy pad, and thus a bonding strength of the chip may be further improved.

DESCRIPTION OF DRAWINGS

FIG. 1 shows a package substrate of a comparative example.

FIG. 2 is a view showing a package substrate according to a first embodiment.

FIG. 3 is a plan view of the package substrate shown in FIG. 2.

FIG. 4 shows a modified example of the package substrate shown in FIG. 2.

FIGS. 5 to 9 are views for explaining a method of manufacturing a package substrate according to an embodiment in the order of processes.

FIG. 10 is a view showing a package substrate according to a second embodiment.

FIG. 11 is a view showing a package substrate according to a third embodiment.

FIG. 12A shows a pad portion before bonding a chip.

FIG. 12B shows the pad portion after bonding the chip.

FIG. 13 shows a modified example of a pad portion according to an embodiment.

FIGS. 14A and 14B are views showing a change in the height of the underfill displayed by the pad portion shown in FIG. 13.

BEST MODE

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

FIG. 1 shows a package substrate of a comparative example.

Referring to FIG. 1, the package substrate of the comparative example includes an insulating layer 10, a circuit pattern 20, an adhesive layer 30, a chip 40, a bump 50, and an underfill 60.

That is, the package substrate of the comparative example includes an insulating layer 10 and a circuit pattern 20 disposed on the insulating layer 10. The circuit pattern 20 includes a pad for mounting a chip 40.

Then, the chip 40 including the bump 50 is disposed on the circuit pattern 20. At this time, the adhesive layer 30 is disposed between the bump 50 of the chip 40 and the circuit pattern 20 to increase a bonding force between the bump 50 and the circuit pattern 20.

In addition, the package substrate of the comparative example as described above includes an underfill 60 disposed on a side surface of the chip 40 and a space between the chip 40 and the insulating layer 10.

In the package substrate of the comparative example, the chip is adhered on the substrate by aligning the chip 40 on which the bump 50 is formed and the substrate on which the circuit pattern 20 is formed, applying the adhesive layer 30, and performing a fusion process through reflow.

Thereafter, the comparative example proceeds with a process of applying the underfill 60 in a manner using a capillary phenomenon due to surface tension after a cleaning step of substances such as flux, and finally proceeds with a process of curing the underfill 60.

As described above, when a chip is mounted by applying the flip chip bonding method to the package substrate of the comparative example, the process of forming the underfill must be necessarily included, and thus, the manufacturing time increases or the manufacturing process becomes complicated.

In addition, when the space between the chip and the insulating layer is not sufficiently secured, the package substrate of the comparative example has a problem in that the underfill does not normally penetrate into the space between the insulating layer and the chip, and thus bonding strength decreases.

In addition, a thickness of the chip of the package substrate of the comparative example, a thickness of the substrate including the insulating layer and the circuit pattern, a thickness of the bump, and a thickness of the adhesive layer directly affect the overall volume, thereby increasing the product size.

Meanwhile, recently, efforts have been made to develop an improved 5G (5th generation) communication system or a pre-5G communication system in order to meet a demand for wireless data traffic. Here, the 5G communication system uses ultra-high frequency (mmWave) bands (sub 6 GHz, 28 GHz, 38 GHz, or higher frequencies) to achieve high data transfer rates.

In addition, integration technologies such as beamforming, massive multi-input multi-output (massive MIMO), and array antennas have been developed in the 5G communication system in order to reduce a path loss of radio waves and increase a transmission distance of radio waves in the ultra-high frequency band. Antenna systems are relatively large given that they can consist of hundreds of active antennas of wavelengths in these frequency bands.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

However, such a package substrate for 5G use may not be able to apply the underfill depending on the RF bandwidth, and has a problem in that the chip mounting strength is reduced because the underfill cannot be formed.

Accordingly, the embodiment allows the underfill to be naturally formed during the chip mounting process without a separate underfill forming process. Specifically, the embodiment allows a fillet to be formed around the mounted chip by softening or changing a phase of the insulating layer in the bonding process of mounting the chip on the insulating layer of the substrate. In other words, the embodiment enables the formation of an underfill surrounding the periphery of the chip using a substrate on which the chip is mounted.

Hereinafter, a package substrate according to an embodiment will be described in detail.

FIG. 2 is a view showing a package substrate according to a first embodiment, and FIG. 3 is a plan view of the package substrate shown in FIG. 2. Specifically, FIG. 2 is a cross-sectional view taken in a direction A-A' in the plan view of FIG. 3.

Referring to FIGS. 2 and 3, the package substrate 100 according to the first embodiment includes an insulating layer 110, a circuit pattern 120, a chip 130, and a bump 140.

Before describing FIGS. 2 and 3, the package substrate according to the embodiment may have a multilayer structure based on an insulating layer. That is, the package substrate in FIG. 2 is illustrated as including a single insulating layer, but is not limited thereto. For example, the package substrate in the embodiment may include a substrate having a stacked structure of a plurality of insulating layers. For example, the insulating layer 110 in the package substrate 100 may have a multilayer structure. However, the embodiment will be mainly described with respect to the insulating layer in the portion on which the chip is mounted among the insulating layers having a multilayer stacked structure.

The insulating layer 110 is a substrate on which an electric circuit capable of changing wiring is formed, and may include a printed circuit board, a wiring board, and an insulating substrate made of an insulating material capable of forming circuit patterns on a surface.

For example, the insulating layer 110 may be rigid or flexible. For example, the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, the insulating layer 110 may include an optically isotropic film. As an example, the insulating layer 110 may include cyclic olefin copolymer (COC), cyclic olefin polymer (COP), optically isotropic PC, optically isotropic polymethylmethacrylate (PMMA), or the like.

In addition, the insulating layer 110 may be partially bent while having a curved surface. That is, the insulating layer 110 may partially have a plane and may partially be bent while having a curved surface. Specifically, an end portion of the insulating layer 110 may be bent while having a curved surface, or bent or crooked while having a surface with a random curvature.

In addition, the insulating layer 110 may be a flexible substrate having flexibility. In addition, the insulating layer 110 may be a curved or bent substrate. At this point, the insulating layer 110 may form a wiring layout for electrical wirings which connect circuit components based on a circuit design, and electrical conductors may be disposed on an insulating material. In addition, the insulating layer 110 may form wiring for mounting electrical components and connecting them in a circuit, and may mechanically fix components other than the electrical connection function of the components.

However, the insulating layer 110 of the embodiment may be made of an insulating material that is softened or changed in phase by heat applied during a bonding process for mounting a chip 130.

For example, the insulating layer 110 may be formed of an epoxy capable of shape (or phase) transformation (Glass transition phase/beta phase).

For example, the insulating layer 110 may be made of a thermoplastic resin that softens (or melts) at a predetermined temperature. Specifically, the insulating layer 110 may be composed of at least one thermoplastic resin of polyethylene terephthalate (PET), liquid crystal polymer (LCP), and polyether ether ketone (PEEK) polytetrafluoroethylene (PTFE), polyphenylene sulfide (PPS), and photo isotropic polymethylmethacrylate (PMMA) having a specific glass transition temperature (Tg).

The thermoplastic resin as described above has a property that softens and melts at a temperature above a certain temperature. Accordingly, the insulating layer 110 of the embodiment is made of a thermoplastic resin, and accordingly, the insulating layer 110 is softened by heat applied during a bonding process of a chip 130, thereby allowing the chip 130 to penetrate into the insulating layer 110.

Meanwhile, the insulating layer 110 of the embodiment may be formed of a liquid crystal polymer (LCP). The liquid crystal polymer (LCP) has a low dielectric constant, and thus RF performance can be improved in an RF communication environment such as a 5G environment. In addition, when the insulating layer 110 is formed of a liquid crystal polymer (LCP) and an underfill is formed using the insulating layer 110, it is possible to minimize the degradation of RF performance such as 5G using mm wave due to the underfill.

The insulating layer 110 may be divided into a plurality of regions.

For example, the insulating layer 110 may include a first region 111 and a second region 112.

The first region 111 may correspond to a region in which the chip 130 is mounted. For example, the first region 111 may be a region overlapping the chip 130 in a vertical direction. For example, the first region 111 may be a region to which heat applied during the bonding process of the chip 130 is provided. For example, the first region 111 may be a region softened (or melted) during the bonding process of the chip 130.

The second region 112 may be a region other than the first region 111.

An upper surface of the first region 111 may be positioned higher than an upper surface of the second region 112. For example, the upper surface of the first region 111 may be positioned closer to an upper surface of the chip 130 than the upper surface of the second region 112. For example, a height of the upper surface of the first region 111 may be close to a height of the upper surface of the chip 130 compared to a height of the upper surface of the second region 112.

That is, the upper surfaces of the first region 111 and the second region 112 before the chip 130 are mounted may be positioned on the same plane. In addition, a part of the chip 130 is depressed or buried in the first region 111 of the insulating layer 110 after the chip 130 is mounted. Accordingly, the first region 111 may expand upward by an amount corresponding to a volume of the depressed or buried chip 130. In addition, a part of the expanded first region 111 may form a fillet surrounding a side surface of the chip 130.

In other words, the first region 111 of the insulating layer 110 may include a first portion surrounding a lower surface of the chip 130. The first portion may be in contact with a lower surface of the chip 130. The first portion may be in contact with a side surface of a bump 140 of the chip 130. The first portion may be in contact with a side surface of a circuit pattern 120 connected to the bump 140. That is, the first portion may be formed to surround a lower surface of the chip 130, a side surface of the bump 140, and a side surface of the circuit pattern 120.

The first region of the insulating layer 110 may include a second portion 111P extending from the first portion. The second portion 111P may form a fillet surrounding a side surface of the chip 130. That is, the second portion 111P of the first region 111 in a state in which the plane is maintained may have a convex shape protruding upward as the chip 130 is depressed into the first region 111. In addition, the second portion 111P of the first region 111 is formed to surround the side surface of the chip 130, and serves to improve bonding strength of the mounted chip 130.

In other words, the insulating layer 110 in the embodiment includes a first region 111 and a second region 112. In this case, the first region 111 functions as an underfill of the chip 130. However, the first region 111 and the second region 112 refer to the same single insulating layer. That is, the embodiment uses the insulating layer of the substrate on which the chip 130 is mounted to form the underfill surrounding the chip 130 while mounting the chip 130.

Meanwhile, the first region 111 and the second region 112 of the insulating layer 110 may have different characteristics. Here, the characteristic may mean a property of the insulating layer 110, or alternatively, may mean a unique characteristic corresponding to a type of the insulating layer 110.

That is, the first region 111 and the second region 112 are a single insulating layer. However, unlike the second region 112, the first region 111 undergoes a state change such as shape deformation or softening and hardening during a bonding process for mounting the chip 130.

Accordingly, the first region 111 and the second region 112 may have different hardness. For example, unlike the second region 112, the first region 111 may have a higher hardness than the second region 112 as it undergoes softening and hardening once more.

In addition, when the insulating layer 110 is formed of a liquid crystal polymer (LCP), a grain may be formed inside the insulating layer 110. Preferably, the insulating layer 110 may have a nematic structure. The nematic structure may mean a state in which all molecules have the same directionality. Accordingly, the insulating layer 110 may have a grain corresponding to the directionality of the molecules by the nematic structure.

Preferably, the insulating layer 110 may be a polymer belonging to a category of P-hydroxybenzoic acid (benzoic acid with OH in the para-position) and crystalline aromatic polyesters based on p-hydroxybenzoic acid and related monomers.

Preferably, the insulating layer 110 may include a polymer material such as Vectron (a product obtained by melt spun Vectra) or Kevlar.

For example, the insulating layer 110 may be a liquid crystal polymer (LCP) as described above, and alternatively may be an anisotropic film such as high-density polyethylene (HDPE). In other words, the insulating layer 110 may be any one of various films containing a polymer material in which molecules are arranged with the same directionality as they have a nematic structure Accordingly, the molecules of the insulating layer 110 may be disposed to have the same directionality before the chip 130 is mounted.

At this time, when pressure is applied to the first region 111 of the insulating layer 110 while the chip 130 is mounted, the directionality of molecules in the first region 111 (for example, a grain direction) may change. For example, grain directions of the first region 111 and the second region 112 of the insulating layer 110 may have a first directionality parallel to an upper surface or a lower surface of the insulating layer 110 before the chip 130 is mounted.

Also, when a pressure is applied to the first region 111 of the insulating layer 110 after the chip 130 is mounted, the grain direction of the first region 111 is changed. For example, the grain direction of the first region 111 may have a second directionality having a predetermined inclination angle based on the first directionality.

As described above, the embodiment uses the insulating layer 110 to form an underfill surrounding the chip 130 in the process of mounting the chip 130 as described above, and accordingly, a separate process for forming the underfill may be omitted.

Meanwhile, the insulating layer 110 may have a specific glass transition temperature (Tg). For example, the insulating layer 110 may have a glass transition temperature (Tg) corresponding to a temperature applied to the chip 130 or the insulating layer 110 during a bonding process for mounting the chip 130. In general, a temperature (hereinafter, referred to as a bonding temperature) applied to the chip 130 or the insulating layer 110 is about 260° C. in the bonding process for mounting the chip 130.

Accordingly, the glass transition temperature (Tg) of the insulating layer 110 in the embodiment may have a value similar to 260° C. For example, the glass transition temperature (Tg) of the insulating layer 110 may be 240° C. to 300° C. However, when the glass transition temperature (Tg) of the insulating layer 110 is higher than the bonding temperature, the insulating layer 110 may not be softened during the bonding process. Accordingly, the glass transition temperature (Tg) of the insulating layer 110 of the embodiment may be lower than the bonding temperature. For example, the glass transition temperature (Tg) of the insulating layer 110 may be 200° C. to 259° C., but is not limited thereto. And, when the glass transition temperature (Tg) of the insulating layer 110 is lower than the bonding temperature as described above, the insulating layer 110 having a high coefficient of thermal expansion is subsequently solidified and contracted, thereby stably fixing between the bump 140 of the mounted chip 130 and the circuit pattern 120.

A circuit pattern 120 is disposed on a surface of the insulating layer 110. For example, the circuit pattern 120 is disposed on an upper surface of the insulating layer 110. At this time, although it is illustrated that the circuit pattern 120 is disposed only on an upper surface of the insulating layer 110 in the drawing, the embodiment is not limited thereto. For example, a circuit pattern may be disposed not only on the upper surface of the insulating layer 110, but also under the lower surface of the insulating layer 110.

The circuit pattern 120 includes a pad electrically connected to the chip 130.

Specifically, the circuit pattern 120 includes a first portion 121 disposed on the second region 112 of the insulating layer 110. The first portion 121 may be disposed on an upper surface of the insulating layer 110. For example, the first portion 121 may be disposed in a direction parallel to the upper surface of the insulating layer 110.

The circuit pattern 120 may include a second portion 122 buried in the insulating layer 110.

The second portion 122 may be buried in the first region 111 of the insulating layer 110. For example, the second portion 122 may be a pad contacting the bump 140 of the chip 130. In addition, a position of the second portion 122 before bonding of the chip 130 may be different from a position of the second portion 122 after bonding of the chip 130. For example, the second portion 122 may be disposed on the upper surface of the first region 111 of the insulating layer 110 before the chip 130 is bonded. In addition, the second portion 122 may be buried in the first region 111 of the insulating layer 110 by a pressure applied during bonding of the chip 130.

The circuit pattern 120 may include a third portion 123 connecting the first portion 121 and the second portion 122.

The third portion 123 may be disposed to be inclined with respect to an upper surface or a lower surface of the insulating layer 110. That is, the third portion 123 may be buried in the insulating layer 110. Specifically, the third portion 123 may be buried in the first region 111 of the insulating layer 110. In addition, the third portion 123 may connect the first portion 121 and the second portion 122 of the circuit pattern 120 in the first region 111 of the insulating layer 110. Specifically, the third portion 123 may connect the first portion 121 and the second portion 122 of the circuit pattern 120 in an oblique line in the first region 111. The third portion 123 may have different positions before and after bonding of the chip 130. For example, the third portion 123 may be disposed on the upper surface of the second region 112 of the insulating layer 110 before the chip 130 is bonded. In addition, the third portion 123 may be buried in the first region 111 of the insulating layer 110 by a pressure applied during bonding of the chip 130.

As shown in FIG. 3, the circuit pattern 120 may include a plurality of pad portions. The pad portion may refer to a pattern connected to the chip 130 among the circuit patterns 120 disposed on the upper surface of the insulating layer 110. In this case, FIG. 3 is a plan view of the package substrate shown in FIG. 2.

The pad portion may include first to eighth pad portions 120a, 120b, 120c, 120d, 120e, 120f, 120g, and 120h. The number of the pad portions may correspond to the number of bumps 140 formed on the chip 130. Alternatively, the number of the pad portions may be greater or less than the number of bumps 140 formed on the chip 130. However, although the drawing shows that the pad portion includes the first to eighth pad portions 120a, 120b, 120c, 120d, 120e, 120f, 120g, and 120h, the embodiment is not limited thereto. For example, the number of the pad portions may be less than eight, and alternatively, the number of the pad portions may be greater than nine.

Meanwhile, as described above, the first portion 121 of the circuit pattern 120 may be disposed on the second region 112 of the insulating layer 110. For example, the first portion 121 may be disposed to overlap in a direction perpendicular to the second region 112 of the insulating layer 110. For example, the first portion 121 may be disposed on an upper surface of the second region 112 of the insulating layer 110.

The second portion 122 of the circuit pattern 120 may be buried in the first region 111 of the insulating layer 110. For example, the second portion 122 may be disposed to be surrounded by the first region 111 of the insulating layer 110 of the insulating layer 110.

For example, the third portion 123 of the circuit pattern 120 may be buried in the first region 111 of the insulating layer 110. Also, at least a portion of the third portion 123 of the circuit pattern 120 may be disposed on the upper surface of the second region 112 of the insulating layer 110 together with the first portion 121.

However, the third portion 123 of the embodiment may be disposed with a specific directionality. For example, a length of the third portion 123 may be increased by pressure applied during the bonding process of the chip 130. For example, the third portion 123 may have a first length before bonding of the chip 130, and may have a second length longer than the first length after bonding of the chip 130. For example, the circuit pattern 120 of the embodiment has a stretchable or flexible characteristic. In this case, the directionality of the third portion 123 may correspond to a position where the second portion 122 of each pad portion is disposed from a center of the region where the chip 130 is disposed.

For example, the pad portion of the embodiment may be positioned in any one of the first to fourth directions 1D, 2D, 3D, and 4D from a center of the region where the chip 130 is disposed.

For example, the second portion of the first pad portion 120a may be disposed in a first diagonal direction 4D from the center of the region in which the chip is disposed. For example, the second portion of the second pad portion 120b may be disposed in the first direction 1D, which is a direction perpendicular to the center. For example, the second portion of the third pad portion 120c may be disposed in a second diagonal direction 3D from the center of the region in which the chip is disposed. For example, the second portion of the fourth pad portion 120d may be disposed in the second direction 2D, which is a horizontal direction from the center of the region in which the chip is disposed. For example, the second portion of the fifth pad portion 120e may be disposed in a first diagonal direction 4D from the center of the region in which the chip is disposed. For example, the second portion of the sixth pad portion 120f may be disposed in the first direction 1D, which is a direction perpendicular to the center of the region in which the chip is disposed. For example, the second portion of the seventh pad portion 120g may be disposed in a second diagonal direction 3D from the center of the region in which the chip is disposed. For example, the second portion of the eighth pad portion 120h may be disposed in the first direction 1D, which is a horizontal direction from the center of the region in which the chip is disposed.

In addition, the third portion of each pad portion may be disposed with a directionality corresponding to the direction in which the second portion is disposed from the center of the region in which the chip is disposed.

That is, a second portion of the first pad portion 120a is disposed in the first diagonal direction 4D from the center of the region in which the chip is disposed and accordingly, a third portion of the first pad portion 120a may be disposed on the insulating layer 110 in the first diagonal direction 4D.

In addition, a second portion of the second pad portion 120b is disposed in the first direction 1D, which is a direction perpendicular to the center, and accordingly, a third portion of the second pad portion 120b may be disposed on the insulating layer 110 in the first direction 1D.

In addition, a second portion of the third pad portion 120c is disposed in a second diagonal direction 3D from the center of the region in which the chip is disposed, and accordingly, a third portion of the third pad portion 120c may be disposed on the insulating layer 110 in the second diagonal direction 3D.

In addition, a second portion of the fourth pad portion 120d is disposed in the second direction 2D, which is a horizontal from the center of the region in which the chip is disposed, and accordingly, a third portion of the fourth pad portion 120d may be disposed on the insulating layer 110 in the second direction 2D.

In addition, a second portion of the fifth pad portion 120e is disposed in a first diagonal direction 4D from the center of the region in which the chip is disposed, and accordingly, a third portion of the fifth pad portion 120e may be disposed on the insulating layer 110 in the first diagonal direction (4D).

In addition, a second portion of the sixth pad portion 120f is disposed in the first direction 1D, which is a direction perpendicular to the center of the region in which the chip is disposed, and accordingly, a third portion of the sixth pad portion 120f may be disposed on the insulating layer 110 in the first direction 1D.

In addition, a second portion of the seventh pad portion 120g is disposed in a second diagonal direction 3D from the center of the region in which the chip is disposed, and accordingly, a third portion of the seventh pad portion 120g may be disposed on the insulating layer 110 in the second diagonal direction 3D.

In addition, a second portion of the eighth pad portion 120h is disposed in the first direction 1D, which is a horizontal direction from the center of the region in which the chip is disposed, and accordingly, a third portion of the eighth pad portion 120h may be disposed on the insulating layer 110 in the first direction 1D.

That is, the second portion of each pad portion as described above may be disposed in a radial shape within the first region 111 of the insulating layer 110. In addition, the second portions of each pad portion may be disposed to be spaced apart from each other at the same distance. Accordingly, the embodiment can solve a reliability problem that may occur when the second portion of the pad portion is moved.

That is, the second portion of each of the pad portions may move (eg, elastically extend) in a specific direction during the bonding process of the chip 130. In this case, when an arrangement direction of the second portion of each of the pad portions is different from the moving direction, reliability problems such as breakage of the second portion during the moving process may occur. Therefore, the second portion of each pad portion of the embodiment is arranged in a direction corresponding to the moving direction in the bonding process of the chip 130, so that the reliability of the second portion may be maintained even after bonding of the chip 130.

Meanwhile, the circuit pattern 120 as described above may be formed of a metal material having high electrical conductivity. For this, the circuit pattern 120 may be formed of at least one metal material selected from among gold (Au), silver (Ag), platinum (Pt), titanium (Ti), tin (Sn), copper (Cu), and zinc (Zn). In addition, the circuit pattern 120 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the circuit pattern 120 may be formed of copper (Cu) having high electrical conductivity and a relatively low cost.

The circuit pattern 120 may be formed by an additive process, a subtractive process, a modified semi additive process (MSAP), and a semi additive process (SAP) process, which are typical circuit board manufacturing processes. and a detailed description thereof will be omitted here.

A chip 130 is disposed on the circuit pattern 120. For example, the chip 130 includes a bump 140. The bump 140 may be a gold bump, but is not limited thereto. In addition, the bump 140 may have a rectangular cross-section, but is not limited thereto. For example, the bump 140 may have a circular or elliptical cross-section.

At least a part of the chip 130 may be buried in the insulating layer 110. For example, at least a part of the chip 130 may be buried in the first region 111 of the insulating layer 110.

That is, a lower surface of the chip 130 may be positioned lower than an upper surface of a part of the insulating layer 110. For example, a lower surface of the chip 130 may be positioned lower than an upper surface of the second region 112 of the insulating layer 110. For example, a lower surface of the chip 130 may be positioned lower than an upper surface of the first region 111 of the insulating layer 110. Accordingly, a lower region of the chip 130 may be buried in the insulating layer 110. For example, a lower region of the chip 130 may be buried in the first region 111 of the insulating layer 110.

In addition, a lower surface of the chip 130, specifically, a region between bumps 140 disposed under a lower surface of the chip 130 may be filled by the first region 111 of the insulating layer 110. That is, the lower region of the chip 130 may be depressed into the first region 111 of the insulating layer 110 as pressure is applied to the chip 130 in the bonding process of the chip 130. In addition, the first region 111 of the insulating layer 110 may extend upward as the chip 130 is depressed into the first region 111 of the insulating layer 110. For example, the first region 111 may extend upward by a volume of a buried portion as the chip 130 is buried in the first region 111 of the insulating layer 110. For example, the first region 111 may be deformed into an upwardly convex shape according to the burying of the chip 130. In addition, the first region 111 forms an underfill 111P extending to a side surface of the buried chip 130.

As described above, the embodiment may allow deformation of the insulating layer 110 in the bonding process of the chip 130 without a process of forming a separate underfill, and may allow a portion of the insulating layer 110 to form the underfill 111P to extend to the side surface of the chip 130 by deformation of the insulating layer 110.

Meanwhile, the chip 130 may be a passive device. For example, the chip 130 may be a passive device such as a wiring, a resistor, and a chip. The chip 130 may be an active device. For example, the chip 130 may be an active device such as a multiplexer, an application specific integrated circuit (ASIC), or a wireless communication module. In addition to this, the chip 130 may include an optical device such as a lens or a waveguide, a magnetic device, and an electrochemical device such as a battery or an enzyme sensor.

According to the embodiment, the first region 111 of the insulating layer 110 may include a first portion surrounding a lower surface of the chip 130. The first portion may be in contact with a lower surface of the chip 130. The first portion may be in contact with a side surface of the bump 140 of the chip 130. The first portion may be in contact with a side surface of the circuit pattern 120 connected to the bump 140. That is, the first portion may be formed to surround the lower surface of the chip 130, the side surface of the bump 140, and the side surface of the circuit pattern 120. The first region of the insulating layer 110 may include a second portion 111P extending from the first portion. The second portion 111P may form a fillet surrounding the side surface of the chip 130. That is, the second portion 111P of the first region 111 may maintain a flat surface, and may have a convex shape protruding upward when the chip 130 is buried in the first region 111. In addition, the second portion 111P of the first region 111 is formed to surround the side surface of the chip 130, and serves to improve bonding strength of the mounted chip 130.

In other words, the insulating layer 110 in the embodiment includes a first region 111 and a second region 112. In this case, the first region 111 functions as an underfill of the chip 130. However, the first region 111 and the second region 112 refer to the same single insulating layer. That is, the embodiment uses the insulating layer of the substrate on which the chip 130 is mounted to form the underfill surrounding the chip 130 while mounting the chip 130.

In addition, the circuit pattern according to the embodiment includes a plurality of pad portions including first to third portions. In this case, each of the second portions of the plurality of pad portions may have a radial shape within the first region 111 of the insulating layer 110 and may be disposed to be spaced apart from each other by a predetermined distance. Accordingly, the embodiment can solve a reliability problem that may occur when the second portion of the pad portion is moved.

That is, the second portion of each of the pad portions may move (eg, elastically extend) in a specific direction during the bonding process of the chip 130. In this case, when an arrangement direction of the second portion of each of the pad portions is different from the moving direction, reliability problems such as breakage of the second portion during the moving process may occur. Accordingly, the reliability of the second portion can be improved even after the chip 130 is bonded by making the second portion of each of the pad portions of the embodiment to be arranged in a direction corresponding to the moving direction in the bonding process of the chip 130.

Meanwhile, a lower surface of the bump 140 of the chip 130 of the first embodiment is in direct contact with the upper surface of the third portion 123 of the pad portion of the circuit pattern 120. That is, the bonding process of the chip 130 in the embodiment is performed while the first region of the insulating layer 110 is softened, and accordingly, there is no need to dispose an additional adhesive layer between the bump and the pad portion.

FIG. 4 shows a modified example of the package substrate shown in FIG. 2.

Referring to FIG. 4, the package substrate 100A includes an insulating layer 110, a circuit pattern 120, a chip 130, a bump 140, and an adhesive layer 150.

That is, referring to FIG. 2, the bump 140 disposed on the lower surface of the chip 130 and the pad that is the third portion of the circuit pattern 120 directly contacted each other.

Alternatively, an adhesive layer 150 may be additionally disposed between the pad, which is the second portion of the circuit pattern 120, and the bump 140.

The adhesive layer 150 may be a Sn layer, but is not limited thereto. For example, the adhesive layer 150 may be formed of any one of a solder, a solder paste, and a solder ball.

That is, the bonding process of the chip 130 in the embodiment is performed in a state in which the adhesive layer 150 is disposed on a lower surface of the bump 140 or an upper surface of the second portion of the circuit pattern 120. In addition, the adhesive layer 150 may be melted by a heat applied during the bonding process of the chip 130, thereby further improving the bonding force between the bump 140 and the circuit pattern 120.

FIGS. 5 to 9 are views for explaining a method of manufacturing a package substrate according to an embodiment in the order of processes.

Referring to FIG. 5, the embodiment firstly prepares the insulating layer 110. The insulating layer 110 is a substrate on which an electric circuit capable of changing wiring is formed, and may include all of a printed circuit board, a wiring board, and an insulating substrate made of an insulating material capable of forming circuit patterns on the surface.

In this case, the insulating layer 110 of the embodiment may be made of an insulating material that is softened or changed in phase by heat applied during a bonding process for mounting a chip 130. For example, the insulating layer 110 may be formed of an epoxy capable of shape (or phase) transformation (Glass transition phase/beta phase).

When the insulating layer 110 is prepared, the embodiment forms a circuit pattern 120 on the insulating layer 110. The circuit pattern 120 may include traces for general electrical signal transmission. In addition, the circuit pattern 120 may include a pad portion for mounting the chip 130. The pad portion includes a first portion 121, a second portion 122, and a third portion 123 disposed on an upper surface of the insulating layer 110. In this case, the first portion 121, the second portion 122, and the third portion 123 of the pad portion formed above may be positioned on the same plane.

Next, as shown in FIG. 6, the embodiment may perform a bonding process in which heat and pressure are applied in a state in which the chip 130 in which the bump 140 is formed on the circuit pattern 120 is aligned. In this case, the heat may be generated by a heater attached to a bonding equipment head. However, the embodiment is not limited thereto. For example, the heat may be generated through a laser, bonding equipment stage heater or other heat source.

In addition, pressure may be applied to the chip 130 in a state in which the heat is applied and in a state in which the bump 140 and the second portion 122 of the circuit pattern 120 are aligned. In addition, a shape of the first region 111 of the insulating layer 110 may be deformed or softened by the applied heat. In this case, a temperature of the applied heat may be greater than a glass transition temperature of the insulating layer 110. Accordingly, a shape of the first region 111 of the insulating layer 110 in contact with the heat may be deformed or softened by the applied heat.

Meanwhile, when the bump 140 and the second portion 122 of the circuit pattern 120 are aligned, the embodiment allows an end of the bump 140 and an end of the second portion 122 not to be aligned in a vertical line with each other. For example, when the bump 140 and the second portion 122 of the circuit pattern 120 are aligned, an end of the bump 140 may be spaced apart from an end of the second portion 122 by a predetermined width in an outward direction. For example, an end of the bump disposed on the second portion of the first pad portion may be spaced apart from an end of the second portion of the first pad portion by a first width W1 in an outward direction. For example, an end of the bump disposed on the second portion of the second pad portion may be spaced apart from an end of the second portion of the second pad portion by a second width W2 in an outward direction. That is, a position of the bump 140 disposed under the lower surface of the chip 130 may be moved during the bonding process of the chip 130. In this case, when the end of the second portion of the pad portion and the end of the bump are aligned on the same vertical line, the second portion and the bump 140 may not be normally connected during the bonding process. Therefore, the embodiment allows the end of the bump 140 to be aligned so as to be positioned outside the end of the second portion of the pad portion as described above, and accordingly, it is possible to solve a connection reliability problem between the bump 140 and the second portion of the pad portion that may occur during the bonding process.

Next, as shown in FIG. 7, the embodiment allows the chip 130 to be depressed or buried into the first region 111 of the insulating layer 110 by applying pressure to the chip 130 while deformation or softening of the first region 111 of the insulating layer 110 is started by the applied heat. That is, since the first region of the insulating layer 110 is in a B-stage state or in a softened state, a lower region of the chip 130 penetrates into the first region 111 of the insulating layer 110 as pressure is applied to the chip 130.

Next, as shown in FIG. 8, when the chip 130 is buried in the first region 111 of the insulating layer 110, the first region 111 of the insulating layer 110 of the embodiment is hardened so that the chip 130 can be stably fixed by the first region 111.

Meanwhile, as shown in FIG. 9, the bonding process in the embodiment may be performed in a state in which the adhesive layer 150 is disposed between the second portion 122 of the circuit pattern 120 and the bump 140. In addition, the adhesive layer 150 improves bonding strength between the bump 140 and the second portion 122 of the circuit pattern 120 during the bonding process.

Hereinafter, a modified example of the package substrate in the embodiment will be described.

FIG. 10 is a view showing a package substrate according to a second embodiment.

Referring to FIG. 10, the package substrate according to the second embodiment may have a multilayer structure.

That is, the manufacturing process of the package substrate according to the first embodiment shown in FIG. 2 may be performed a plurality of times, and the embodiment allows different or identical chips to be respectively mounted on different layers.

Accordingly, the package substrate includes a plurality of substrates 100 on which chips are mounted. The plurality of substrates may be disposed on different layers. In addition, chips may be mounted on the plurality of substrates each having the structure described with reference to FIG. 2.

A first interlayer insulating layer 160 may be disposed in a region between the plurality of substrates. In addition, a second interlayer insulating layer 170 serving as a protective layer may be disposed on an upper substrate among the plurality of substrates. In addition, a via 180 may be formed in the plurality of substrates or the first interlayer insulating layer 160.

In the manufacturing process of the package substrate having the multilayer structure as described above, a process of manufacturing the first layer substrate as shown in FIGS. 5 to 8 may be preferentially proceeded.

Next, the embodiment may proceed with a process of forming a first interlayer insulating layer 160 on the first layer substrate.

Next, the embodiment may proceed with a process of manufacturing the second layer substrate on the first interlayer insulating layer 160 by repeating the process illustrated in FIGS. 5 to 8.

In this case, when the second layer substrate is manufactured, a chip bonding process is performed, and accordingly, a process of burying the chip by softening the second layer substrate is performed. In this case, softening or deformation of the first layer substrate may occur during the chip bonding process of the second layer substrate. Accordingly, a glass transition temperature of the insulating layer constituting the first layer substrate of the embodiment is greater than a glass transition temperature of the insulating layer constituting the second layer substrate. In addition, a chip bonding temperature when the first layer substrate is manufactured is higher than the chip bonding temperature when the second layer substrate is manufactured. Accordingly, the embodiment can solve the problem of softening of the first layer substrate during the bonding process of the second layer substrate, and thus solve the reliability problem.

Meanwhile, a via 180 may be formed in the multilayer package substrate according to the embodiment. In this case, a position change of the via 180 may occur in the chip bonding process. Accordingly, the embodiment may allow the chip disposed on the first layer substrate and the via 180 to be spaced apart by a first distance L1. In addition, the embodiment may allow the chip disposed on the second layer substrate and the via 180 to be spaced apart by a second distance L2. At this time, each of the first distance L1 and the second distance L2 is set to be 4 times or more of a thermal diffusion distance in each substrate.

FIG. 11 is a view showing a package substrate according to a third embodiment.

Referring to FIG. 11, the insulating layer 110 of the package substrate may have a plurality of stacked structures. For example, the insulating layer 110 may include a first insulating layer 110b and a second insulating layer 110a.

At this time, since the first insulating layer 110b has substantially the same configuration as the insulating layer 110 described with reference to FIG. 2, a detailed description thereof will be omitted.

Here, the insulating layer 110 in FIG. 2 has a one-layer structure. In this case, when the insulating layer has a one-layer structure, the second portion 122 of the circuit pattern may pass through the lower surface of the insulating layer 110 in the bonding process of the chip. That is, the lower surface of the second portion of the circuit pattern may be positioned lower than the lower surface of the insulating layer by the heat or pressure applied in the bonding process of the chip. And this may cause a reliability problem.

Accordingly, the embodiment forms the insulating layer in a two-layer structure.

The second insulating layer 110a corresponds to the insulating layer 110 in FIG. 2. In addition, the first insulating layer 110b may be a deformation barrier layer disposed under the second insulating layer 110a.

The second insulating layer 110a may be a cured epoxy or polyimide. For example, the second insulating layer 110a may be a cured insulating layer that cannot be deformed. For example, the second insulating layer 110a may be an insulating layer having a glass transition temperature that is not softened even in the bonding process of the chip. That is, a glass transition temperature of the second insulating layer 110a may be greater than a glass transition temperature of the first insulating layer 110b.

Accordingly, the lower surface of the second portion of the circuit pattern is maximumly moved up to the upper surface of the second insulating layer 110a in the bonding process of the chip. That is, the second insulating layer 110a may serve as a stopper for limiting a maximum movement distance of the second portion of the circuit pattern. Accordingly, when the second portion of the circuit pattern moves to the maximum in the bonding process of the chip, the lower surface of the second portion is positioned on the upper surface of the second insulating layer 110a. Accordingly, the embodiment can prevent a situation in which a part of the circuit pattern is exposed or protruded under the lower surface of the insulating layer when using a single insulating layer, and accordingly, the reliability problem can be solved.

FIG. 12 is a view specifically explaining a third portion of a pad portion in a package substrate according to an embodiment. FIG. 12(A) shows the pad portion before bonding the chip, and FIG. 12(B) shows the pad portion after bonding the chip.

Referring to FIG. 12, the third portion 123 of the pad portion may connect the first portion 121 and the second portion 122 of the pad portion. In this case, a length of the third portion 123 may be increased in the bonding process of the chip. Accordingly, restrictions may occur in a burying process of the chip depending on a line width or a shape of the third portion 123.

Accordingly, the third portion 123 in the embodiment has a plurality of branch lines, and thus the first portion 121 and the second portion 122 are connected through a plurality of branch lines.

For example, the third portion 123 may include a first branch line 123A and a second branch line 123B that connect between the first portion 121 and the second portion 122 and are disposed to be separated from each other.

In this case, a line width of each of the first branch line 123A and the second branch line 1238 may be smaller than a line width of the first portion 121 or a line width of the second portion 122. Accordingly, the embodiment may allow the length of the third portion 123 to be easily increased when the chip is bonded. In addition, the embodiment allows the third portion 123 to have a plurality of branch lines as described above, thereby solving reliability problems such as breakage of the third portion that may occur during bonding of the chip.

Meanwhile, the third portion 123 may have a mesh shape.

FIG. 13 is a view showing a modified example of the pad portion according to the embodiment, and FIG. 14 is a view showing a change in a height of an underfill shown by the pad portion shown in FIG. 13.

Referring to FIG. 13, the embodiment may include a dummy pad 190 disposed in the first region 111 of the insulating layer 110. The dummy pad 190 is a dummy pattern that is not electrically connected to the pad portion and the chip 130.

In the embodiment, the dummy pad 190 as described above is disposed in a region between the pad portions. In addition, the dummy pad 190 is buried in the insulating layer so that the entire region of the chip has a uniform depth during the bonding process of the chip. In addition, the dummy pad 190 serves to increase a height of an underfill portion extending to the side of the chip 130 during the bonding process of the chip.

For example, as shown in (a) of FIG. 14, when the bonding process of the chip 130 is performed in a state in which the dummy pad 190 is not formed, a height of the underfill 111P' of the insulating layer 110 may have a first height H1.

Alternatively, as shown in (b) of FIG. 14, when the bonding process of the chip 130 is performed in a state in which the dummy pad 190 is disposed, the chip 130 may be buried to have a uniform depth over the entire region. In addition, an upper surface of the first region 111 of the insulating layer 110 may further extend upward by an area of the dummy pad 190. For example, when the bonding process of the chip 130 is performed in a state in which the dummy pad 190 is formed, a height of the underfill 111P' of the insulating layer 110 may have a second height H2 greater than the first height H1. In addition, the embodiment may allow the height of the underfill to be increased by the dummy pad 190, thereby further improving the bonding strength of the chip 130.

What is claimed is:

1. A package substrate comprising:
a first substrate; and
a first chip mounted on the first substrate;
wherein the first substrate includes:
a first insulating layer including a first region overlapping the first chip in a vertical direction and a second region other than the first region; and
a circuit pattern disposed on the first region and the second region of the first insulating layer;
wherein the circuit pattern includes:
a pad portion including a first portion disposed on an upper surface of the second region of the first insulating layer and not overlapping the first chip in a vertical direction, a second portion buried in the first region of the first insulating layer and overlapping the first chip in the vertical direction, and a third portion including a buried part buried in the first region of the first insulating layer being disposed between the first portion and the second portion,
wherein an upper surface of the first portion and an upper surface of the second portion have a step, and
wherein the buried part of the third portion of the pad portion is disposed in the first insulating layer with an inclination corresponding to the step.

2. The package substrate of claim 1, wherein at least a part of the first chip is disposed in the first region of the first insulating layer;
wherein the first region of the first insulating layer surrounds a lower surface and a side surface of the first chip,
wherein the first region and the second region of the first insulating layer are a single insulating layer, and
wherein the third portion of the pad portion is disposed at a predetermined inclination angle with respect to an upper surface or a lower surface of the first insulating layer in the first region of the first insulating layer.

3. The package substrate of claim 1, wherein the third portion of the pad portion includes a through hole passing through upper and lower surfaces of the third portion;

wherein the third portion of the pad portion includes:

a first branch line connecting between the first portion and the second portion and positioned at one side of the through hole; and a second branch line connecting between the first portion and the second portion and positioned at the other side opposite to the one side of the through hole.

4. The package substrate of claim 1, wherein the first substrate includes a second insulating layer disposed under a lower surface of the first insulating layer; and wherein the second insulating layer includes a cured epoxy or a thermoplastic resin having a glass transition temperature higher than a glass transition temperature of the first insulating layer.

5. The package substrate of claim 4, wherein the second portion of the pad portion is disposed on an upper surface of the second insulating layer.

6. The package substrate of claim 1, wherein the pad portion includes a plurality of pad portions, wherein the circuit pattern includes a dummy pad positioned between third portions of the plurality of pad portions and electrically insulated from the first chip.

7. The package substrate of claim 1, wherein the first chip includes a bump; and wherein the bump is buried in the first region of the first insulating layer and is in direct contact with an upper surface of the third portion of the pad portion.

8. The package substrate of claim 1, further comprising:

a second substrate disposed on the first substrate and on which a second chip is mounted; and wherein an insulating layer of the second substrate is lower than a glass transition temperature of the first insulating layer of the first substrate.

9. The package substrate of claim 1, wherein the first insulating layer includes at least one thermoplastic resin of Polyethylene terephthalate (PET), Liquid Crystal Polymer (LCP), Polyether ether ketone (PEEK), Polytetrafluoroethylene (PTFE), Poly Phenylene Sulfide (PPS), Photo-isotropic polymethyl methacrylate (PMMA) or a liquid crystal polymer (LCP) having a grain direction in the first region different from a grain direction in the second region.

10. The package substrate of claim 1, wherein a hardness of the first region of the first insulating layer is different from a hardness of the second region of the first insulating layer.

11. The package substrate of claim 1, wherein at least a part of an upper surface of the first region of the first insulating layer is positioned in a plane different from that of at least a part of an upper surface of the second region of the first insulating layer.

12. The package substrate of claim 11, wherein the upper surface of the first region of the first insulating layer includes a convex portion convex in a direction from a lower surface of the first insulating layer toward an upper surface of the first insulating layer.

13. The package substrate of claim 8, wherein the first chip does not overlap with the second chip in the vertical direction.

14. The package substrate of claim 8, further comprising:

a via penetrating from an upper surface of the second substrate to a lower surface of the first insulating layer of the first substrate.

15. The package substrate of 14, wherein the via is disposed in a region between the first chip and the second chip.

* * * * *